(12) United States Patent
Hwang et al.

(10) Patent No.: US 11,962,321 B2
(45) Date of Patent: Apr. 16, 2024

(54) ANALOG-STOCHASTIC CONVERTER FOR CONVERTING ANALOG SIGNAL INTO PROBABILITY SIGNAL BASED ON THRESHOLD SWITCHING ELEMENT

(71) Applicant: POSTECH Research and Business Development Foundation, Pohang-si (KR)

(72) Inventors: Hyun Sang Hwang, Daegu (KR); Myoung Hoon Kwak, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 291 days.

(21) Appl. No.: 17/533,031

(22) Filed: Nov. 22, 2021

(65) Prior Publication Data
US 2022/0166438 A1    May 26, 2022

(30) Foreign Application Priority Data
Nov. 26, 2020   (KR) .................. 10-2020-0161398

(51) Int. Cl.
| | |
|---|---|
| *H03M 1/00* | (2006.01) |
| *G06N 3/047* | (2023.01) |
| *G06N 3/065* | (2023.01) |
| *H03M 1/12* | (2006.01) |
| *G11C 11/54* | (2006.01) |
| *H03K 19/20* | (2006.01) |

(52) U.S. Cl.
CPC ............ *H03M 1/124* (2013.01); *G06N 3/047* (2023.01); *G06N 3/065* (2023.01); *G11C 11/54* (2013.01); *H03K 19/20* (2013.01)

(58) Field of Classification Search
CPC ........ H03M 1/124; G06N 3/047; G06N 3/065
USPC .................................................. 341/155, 133
See application file for complete search history.

(56) References Cited

U.S. PATENT DOCUMENTS

| | | | |
|---|---|---|---|
| 2004/0162725 A1* | 8/2004 | Ueda ........................ | G06N 7/01 704/236 |
| 2013/0073598 A1* | 3/2013 | Jacobson ................... | G06F 5/01 708/250 |

FOREIGN PATENT DOCUMENTS

KR        1020190133532 A      12/2019

* cited by examiner

*Primary Examiner* — Peguy Jean Pierre
(74) *Attorney, Agent, or Firm* — Morgan, Lewis & Bockius LLP

(57) ABSTRACT

There is provided an analog-stochastic converter for converting an analog voltage signal into a pulse signal having a corresponding probability. The analog-stochastic converter is implemented using a threshold switching element and a simple logic circuit, thereby reducing a size of the analog-stochastic converter and enabling a low power operation thereof. In addition, in order to update a weight, instead of an analog signal, a probability signal is applied using the above-described analog-stochastic converter, thereby updating a weight in a fully-parallel manner in a synaptic element array having an intersection structure. Accordingly, it is possible to shorten a time for weight update.

14 Claims, 10 Drawing Sheets

$\Delta W_{ij} = \eta * (p_{xi} \cap p_{\delta j})$ $p_{xi} = 6/8$ $p_{\delta j} = 4/8$

US 11,962,321 B2

ANALOG-STOCHASTIC CONVERTER FOR CONVERTING ANALOG SIGNAL INTO PROBABILITY SIGNAL BASED ON THRESHOLD SWITCHING ELEMENT

CROSS-REFERENCE TO RELATED APPLICATION

This application claims priority to Korean Patent Application No. 2020-0161398 filed on Nov. 26, 2020 in the Korean Intellectual Property Office (KIPO), the entire contents of which are hereby incorporated by reference.

BACKGROUND

1. Technical Field

Example embodiments of the present invention relate to an analog-stochastic converter, and more particularly, to an analog-stochastic converter for converting an analog voltage signal into a pulse signal having a corresponding probability using a threshold switching element to output the converted pulse signal.

2. Related Art

Recently, neuromorphic technologies for mimicking the human brain are attracting attention. Neural network elements that mimic a structure of the human brain are divided into neuron elements that mimic a neuron action and synaptic elements that mimic a synapse action.

Meanwhile, in order to program synaptic elements, the elements are programmed in a column-by-column or row-by-row format.

FIG. 1 is a diagram illustrating the conventional weight updating method.

Referring to FIG. 1, the conventional weight updating method is a method of externally calculating a weight change value $\Delta W_{ij}$ and then transmitting the calculated value to a synaptic array. As the method of transmitting the calculated value to the synaptic array, a half-bias scheme is used. The half-bias scheme is a weight updating method which uses a characteristic in which, when a program voltage $V_{pgm}$ is applied to a synaptic element, a weight is changed, but when a half bias $V_{pgm}/2$ of the program voltage $V_{pgm}$ is applied, a weight is not changed. That is, the half bias $V_{pgm}/2$ is applied only to a target column line, and a bias of 0 is applied to the remaining column lines. In this case, when the half bias $V_{pgm}/2$ is applied as an input signal of a row line, the program voltage $V_{pgm}$ is applied to synapses of the target column so that a weight is changed, and the half bias $V_{pgm}/2$ is applied to the remaining column lines so that a weight is not changed.

As an example, when a $j^{th}$ column line is updated as in FIG. 1, in order to use the half-bias scheme, a pulse having a magnitude of $V_{pgm}/2$ is applied to synapses of the $j^{th}$ column line, and a bias of 0 is applied the remaining columns excluding the $j^{th}$ column line. Thereafter, a programming pulse having a magnitude of $V_{pgm}/2$, which is proportional to the value $\Delta W_{ij}$ calculated through a back-propagation algorithm, is applied to the row line. For example, when a value $\Delta W_{ij}$ is calculated as 0.5, five programming pulses are applied to a first row line, and when a value $\Delta W_{2j}$ is calculated as 0.3, three programming pulses are applied to a second row line. In this case, when a pulse applied from the row line overlaps a pulse applied from the column line, a pulse having a total magnitude of $V_{pgm}$ is applied to the synapses of the $j^{th}$ column line so that a weight of the synapse is changed. Meanwhile, since only a pulse having a magnitude of $V_{pgm}/2$ is applied to synaptic elements of the remaining column lines excluding the $j^{th}$ column line, updating is not performed.

Since the above-described conventional weight updating method is performed in a column-by-column or row-by-row format, when a size of a used synaptic array is increased, the time required for updating a weight is also increased.

RELATED ART DOCUMENTS

Patent Documents

Patent Document 1) Korean Patent Publication No. 10-2019-0133532

SUMMARY

Example embodiments of the present invention provide an analog-stochastic converter for converting an analog voltage signal into a pulse signal having a corresponding probability in order to update a weight using a stochastic characteristic of a threshold switching element.

In some example embodiments, an analog-stochastic converter includes a threshold switching element configured to receive a pulse signal corresponding to an analog signal and be turned on according to the input pulse signal to output a turn-on signal, and a probability conversion circuit configured to detect the turn-on signal output from the threshold switching element and convert the analog signal into a probability signal using the detected turn-on signal.

The probability signal may be determined according to an amplitude of the pulse signal.

As the amplitude of the pulse signal may be increased, a probability of the probability signal is increased, and as the amplitude of the pulse signal is decreased, the probability of the probability signal may be decreased.

The analog-stochastic converter may further include a resistor connected to an output terminal of the threshold switching element.

The probability conversion circuit may include a D flip-flop configured to receive the turn-on signal and a clock signal and output the probability signal.

The probability signal may be determined according to the turn-on signal and the clock signal.

The probability signal may be determined according to a timing at which the clock signal is input with respect to the pulse signal.

The probability conversion circuit may include a transistor which receives the turn-on signal and in which a sample signal is applied to a gate thereof, a capacitor connected to the transistor and configured to store the turn-on signal, and an AND gate configured to receive a storage signal stored in the capacitor and a select signal and output the probability signal.

While the transistor is turned on by the sample signal, the turn-on signal may be stored in the capacitor.

The probability signal may be determined by the storage signal and the select signal.

The probability signal may be determined according to a timing at which the sample signal is input with respect to the pulse signal.

The probability conversion circuit may include a transistor which receives the turn-on signal and in which a sample signal is applied to a gate thereof, a capacitor connected to the transistor and configured to store the turn-on signal, a NOT gate configured to receive a storage signal stored in the capacitor and invert the storage signal to output an inverted signal, and a NOR gate configured to receive the inverted signal and the pulse signal and output the probability signal.

The probability signal may be determined by the inverted signal and the pulse signal.

The probability signal may be determined according to a timing at which the sample signal is input with respect to the pulse signal.

The pulse signal may include a detection section in which the turn-on signal is detected, and a program section (PGM) in which an operation of firing a detection result detected in the detection section to a synaptic element is performed.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
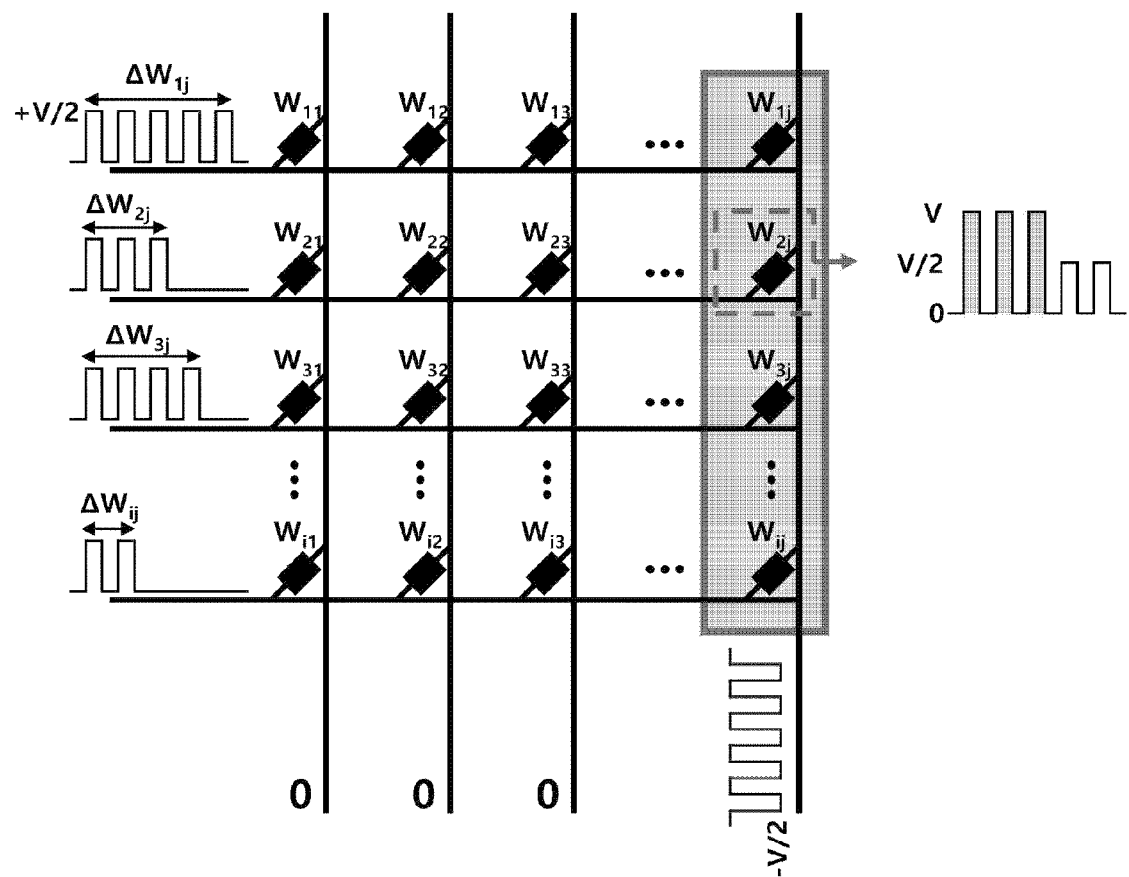
FIG. 1 is a diagram illustrating a conventional weight updating method.

The present invention can be modified in various forms and can have various embodiments. Specific example embodiments will be shown in the accompanying drawings and described in detail. However, it is not intended that the present invention is limited to the specific example embodiments, and it is interpreted that all the conversions, equivalents, and substitutions belonging to the concept and technical scope of the present invention are included in the present invention. In describing the present invention, when it is determined that detailed descriptions of known techniques involved in the present invention make the gist of the present invention obscure, the detailed descriptions thereof will be omitted.

Hereinafter, example embodiments according to the present invention will be described in detail with reference to the accompanying drawings, and in describing the example embodiments with reference to the accompanying drawings, the same or corresponding components are assigned the same reference numerals, and redundant descriptions thereof will be omitted.

Figure 2:
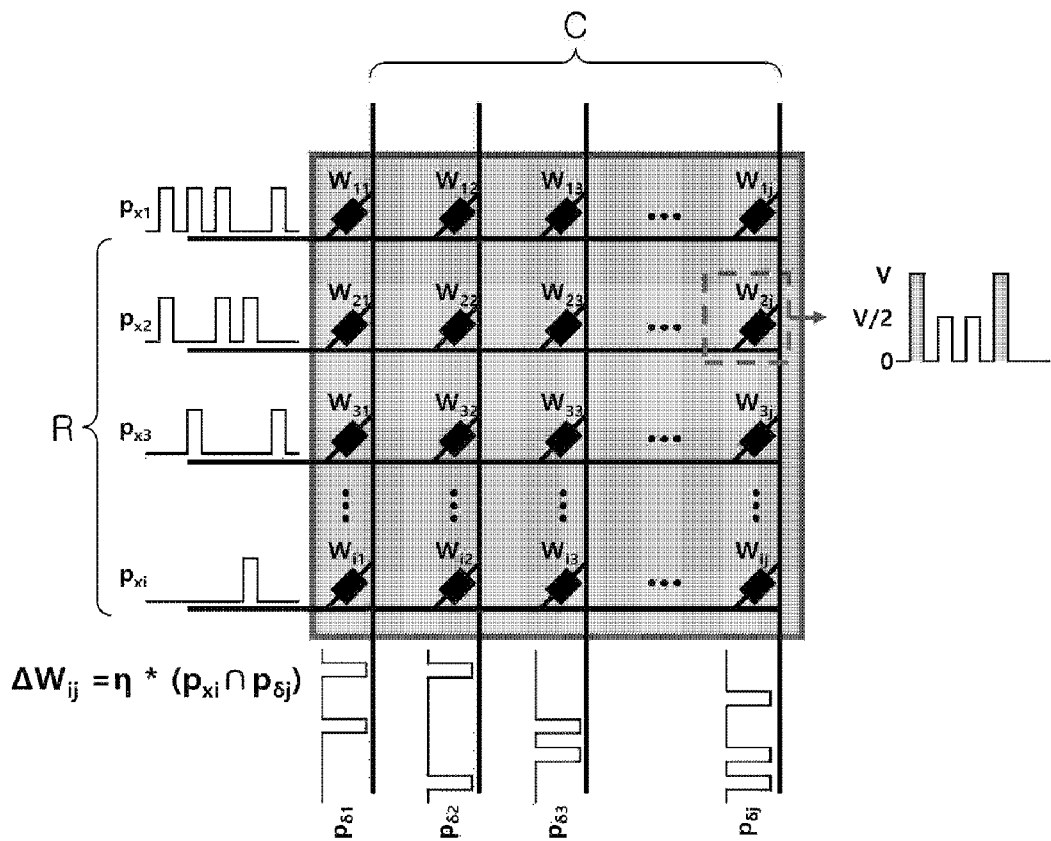
FIG. 2 is a diagram illustrating a fully-parallel weight updating method using a pulse signal having a probability.

FIG. 2 is a diagram illustrating a fully-parallel weight updating method using a pulse signal having a probability.

Referring to FIG. 2, unlike a weight updating method using a column-by-column or row-by-row format shown in FIG. 1, the fully-parallel weight updating method using a pulse signal having a probability is used as a weight updating method using a pulse signal having a probability. That is, a signal is applied to row lines R and column lines C using a half-bias scheme, and a programming pulse is simultaneously applied to all the row lines R and all the column lines C.

In addition, the weight updating method of FIG. 1 uses a method of externally calculating a weight change value $\Delta W_{ij}$ and then transmitting the calculated value to a synaptic array, but in the weight updating method using a pulse signal having a probability shown in FIG. 2, when a pulse signal is applied to the row line R and the column line C, a programming pulse proportional to a value $\Delta W_{ij}$ is applied to synaptic elements.

That is, pulse signals having a probability are applied to each row line R and each column line C so as to have amplitudes of V/2 and −V2, and a total voltage of V is applied to a weight element at which the row line R and the column line C intersect, thereby updating a weight. In this case, an intersection probability of the weight element at which the row line R and the column line C intersect may be a probability of a probability signal obtained by multiplying a probability signal applied from the row line R and a probability signal applied from the column line C.

Figure 3:
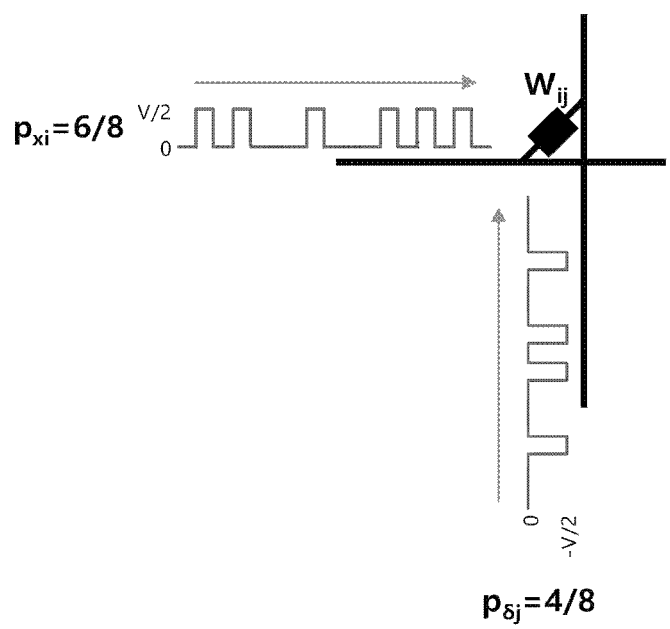
FIG. 3 is a diagram for describing the weight updating method shown in FIG. 2.

FIG. 3 is a diagram for describing the weight updating method shown in FIG. 2.

Figure 4:
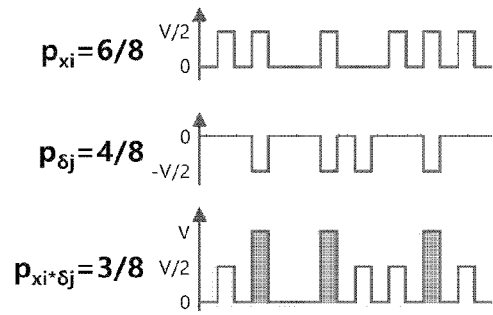
FIG. 4 is a diagram illustrating a probability signal applied to use the weight updating method shown in FIG. 2.

FIG. 4 is a diagram illustrating a probability signal applied to use the weight updating method shown in FIG. 2.

Referring to FIGS. 3 and 4, when a probability signal having an amplitude of V/2 and a probability of $P_{xi}=6/8$ is applied to a row line R, and a probability signal having an amplitude of −V/2 and a probability of $P_{\delta j}=4/8$ is applied to a column line C, a total voltage of V is applied to a synaptic element at which the probability signals intersect, thereby updating a weight. In addition, an intersection probability by the two probability signals may be a probability of $P_{xi}*\delta j=3/8$ which is the product of Pxi=6/8 and $P_{\delta j}=4/8$.

Accordingly, a weight change value $\Delta W_{ij}$ by the weight updating method using a pulse signal having a probability may be expressed as Equation 1 below.

$$\Delta W_{ij}=\eta*(P_{xi}\cap P_{\delta j})$$ [Equation 1]

Here, η denotes a learning rate, $P_{xi}$ denotes a probability signal applied to an $i^{th}$ row line R, and $P_{\delta j}$ denotes a probability signal applied to a $j^{th}$ column line C.

As described above, a probability signal having a probability is simultaneously applied to all the row lines R and all the column lines C, thereby updating all the synaptic elements in a fully-parallel manner. Therefore, it is possible to implement a faster weight updating operation as compared with the conventional weight updating method.

In order to apply a probability signal to the row line R and the column line C, there is a need for a process of converting an analog signal applied to the row line R and the column line C into a probability signal.

Figure 5:
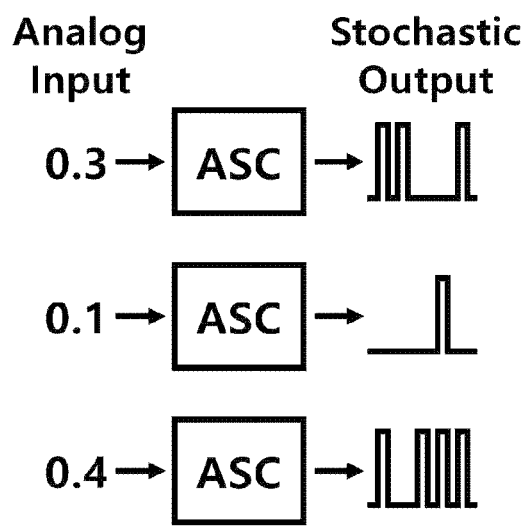
FIG. 5 is a diagram illustrating a process of converting an analog signal into a probability signal.

FIG. 5 is a diagram illustrating a process of converting an analog signal into a probability signal.

Referring to FIG. 5, an analog-stochastic converter (ASC) is required to convert an analog signal into a pulse signal having a probability.

As an example, as shown in FIG. 5, when an analog signal of 0.3 is converted into a probability signal through the ASC, the analog signal may be converted into a probability signal having three pulse widths, an analog signal of 0.1 may be converted into a probability signal having one pulse width, and an analog signal of 0.4 may be converted into a probability signal having four pulse widths. Through the ASC, probability signals converted into pulse signals having a probability may be applied to all row lines R and all column lines C, and it may be possible to update a weight in proportion to a probability signal obtained by multiplying the probability signals applied to the row lines R and the column lines C.

Figure 6:
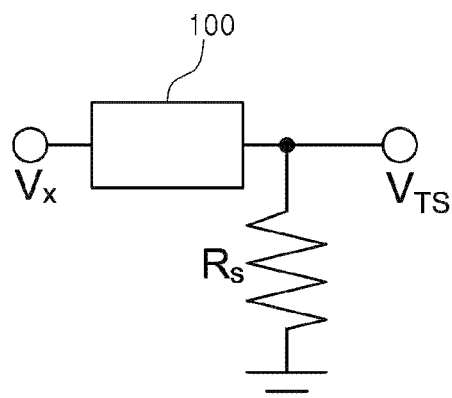
FIG. 6 is a diagram illustrating a connection configuration of a threshold switching element for converting an analog signal into a probability signal according to the present invention.

FIG. 6 is a diagram illustrating a connection configuration of a threshold switching element for converting an analog signal into a probability signal according to the present invention.

Referring to FIG. 6, in a threshold switching element 100 to which an analog signal is input, an output terminal thereof is connected to a resistor $R_s$ in series.

Here, the threshold switching element 100 is a switching element whose resistance is abruptly changed at a specific voltage. When an operating voltage greater than or equal to a threshold voltage is applied, due to a formed conductive filament, the threshold switching element 100 is converted to a turned-on state, and when an operating voltage less than or equal to the threshold voltage is applied, the formed conductive filament is disconnected so that the threshold switching element 100 is converted to a turned-off state. As an example, as the threshold switching element 100, an ovonic threshold switching (OTS) element may be used.

As shown in FIG. 6, the threshold switching element 100 receives a pulse signal V, corresponding to an analog signal through an input terminal, and an output signal $V_{TS}$ due to turning on the threshold switching element 100 is determined according to the input pulse signal $V_x$.

Figure 7:
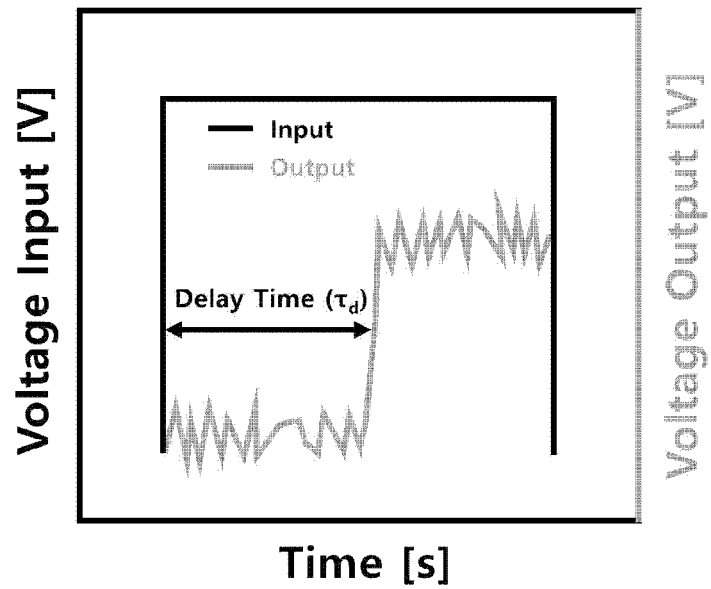
FIG. 7 is a graph showing an output signal according to an input signal in the threshold switching element shown in FIG. 6.

FIG. 7 is a graph showing an output signal according to an input signal in the threshold switching element shown in FIG. 6.

Figure 8:
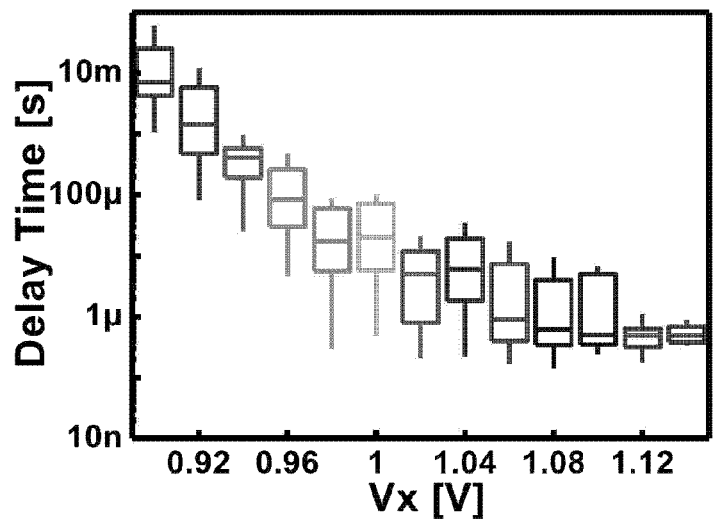
FIG. 8 is a graph showing a delay time change according to an amplitude of an input voltage in the threshold switching element shown in FIG. 6.

FIG. 8 is a graph showing a delay time change according to an amplitude of an input voltage in the threshold switching element shown in FIG. 6.

Referring to FIGS. 7 and 8, as shown in FIG. 7, when a pulse signal V, is applied to the input terminal of the threshold switching element 100, a voltage is applied to the threshold switching element 100 such that the threshold switching element 100 is turned on after a delay time $\tau_d$. That is, the threshold switching element 100 outputs an output signal $V_{TS}$ having the delay time $\tau_d$ according to the input pulse signal $V_x$.

In addition, as shown in FIG. 8, when an amplitude of the pulse signal $V_x$ applied to the threshold switching element 100 is changed, it can be confirmed that the delay time is changed according to the amplitude of the applied pulse signal $V_x$. That is, it can be confirmed that the delay time $\tau_d$ is decreased as the amplitude of the pulse signal $V_x$ is increased. As shown in the graph shown in FIG. 8, it can be confirmed that the delay time $\tau_d$ has a stochastic characteristic due to a change in the delay time $\tau_d$ according to the pulse signal.

Figure 9:
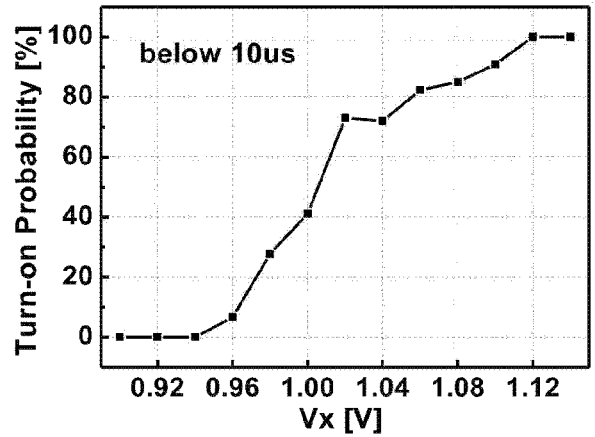
FIG. 9 is a graph showing a turn-on probability of the threshold switching element according to a change in amplitude of an input voltage in the threshold switching element shown in FIG. 6.

FIG. 9 is a graph showing a turn-on probability of the threshold switching element according to a change in amplitude of an input voltage in the threshold switching element shown in FIG. 6.

Figure 10:
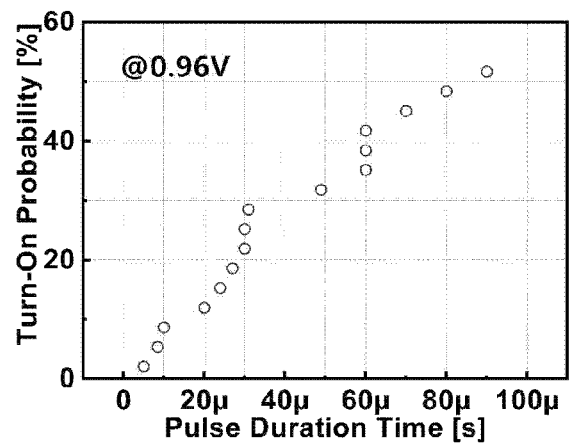
FIG. 10 is a graph showing a turn-on probability of the threshold switching element according to a change in pulse width of an input voltage in the threshold switching element shown in FIG. 6.

FIG. 10 is a graph showing a turn-on probability of the threshold switching element according to a change in pulse width of an input voltage in the threshold switching element shown in FIG. 6.

First, FIG. 9 shows a probability that, when a pulse width of a pulse signal $V_x$ is limited to 10 μm, the threshold switching element 100 is turned on by an input voltage pulse. Referring to FIG. 9, it can be confirmed that, as the pulse signal $V_x$ is increased, the turn-on probability of the threshold switching element is increased within an amplitude of 10 μm.

In addition, FIG. 10 shows the turn-on probability of the threshold switching element 100 according to a pulse width of the pulse signal $V_x$, that is, a pulse duration time, after a $V_x$ value of a pulse signal $V_x$ is fixed at 0.96 V. Referring to FIG. 10, it can be confirmed that, as the pulse width of the pulse signal $V_x$ is increased, the turn-on provability of the threshold switching element is increased.

Figure 11:
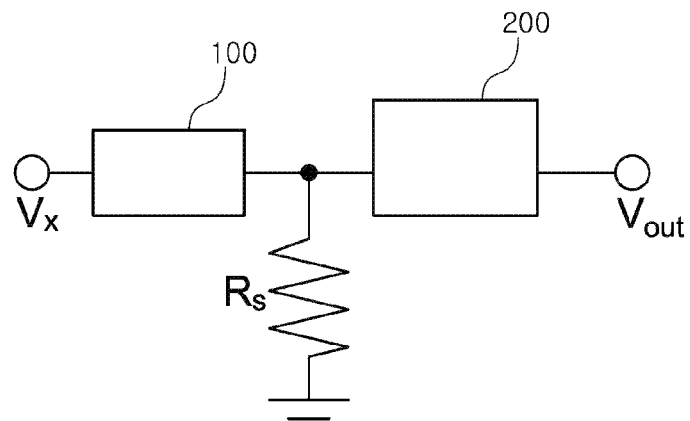
FIG. 11 is a diagram illustrating an analog-stochastic converter according to the present invention.

That is, as shown in FIGS. 9 and 10, it can be confirmed that the turn-on probability of the threshold switching element 100 is controlled by changing the amplitude or pulse width of the applied pulse signal $V_x$, and it can be confirmed that, by using the threshold switching element 100, an analog signal can be converted into a probability signal that is a pulse signal having a probability FIG. 11 is a diagram illustrating an ASC according to the present invention.

Referring to FIG. 11, the ASC according to the present invention includes a threshold switching element 100, a resistor $R_s$, and a probability conversion circuit 200 so as to convert an analog signal into a probability signal.

Here, an output terminal of the threshold switching element 100 may be connected to the resistor $R_s$ and the probability conversion circuit 200. That is, the threshold switching element 100 and the resistor $R_s$ have the same connection form as in FIG. 6, and the probability conversion circuit 200 may be connected to the output terminal of the threshold switching element 100.

The probability conversion circuit 200 may receive an output signal $V_{TS}$ output from the threshold switching element 100, and a probability signal converted by the probability conversion circuit 200 may be output. That is, the probability conversion circuit 200 may detect a turn-on signal output from the threshold switching element 100 and may use the detected signal to output a probability signal converted into a pulse signal having a probability. The probability conversion circuit 200 may be variously implemented using a logic circuit.

Figure 12:
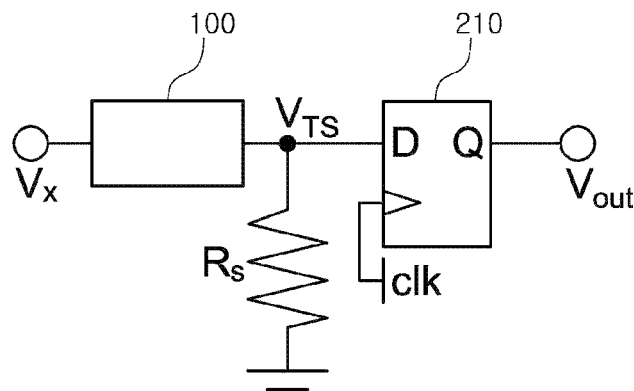
FIG. 12 is a diagram illustrating an analog-stochastic converter according to a first example embodiment of the present invention.

FIG. 12 is a diagram illustrating an ASC according to a first example embodiment of the present invention.

Referring to FIG. 12, the ASC according to the first example embodiment of the present invention may include a threshold switching element 100, a resistor $R_s$, and a D flip-flop 210.

The threshold switching element 100 and the resistor $R_s$ have the same configurations as those of the ASC shown in FIG. 11, and a probability conversion circuit 200 may include the D flip-flop 210.

That is, a pulse signal $V_x$, which is an input analog signal, is input to the threshold switching element 100, and the D flip-flop 210 receives an output signal $V_{TS}$ output by the threshold switching element 100. The D flip-flop 210 outputs a probability signal according to an input signal, which is the output signal $V_{TS}$, and an applied clock signal CLK. In this case, the probability signal output by the D flip-flop 210 may be determined according to an amplitude of the input pulse signal $V_x$ or a timing of the applied clock signal CLK.

Figure 13A:
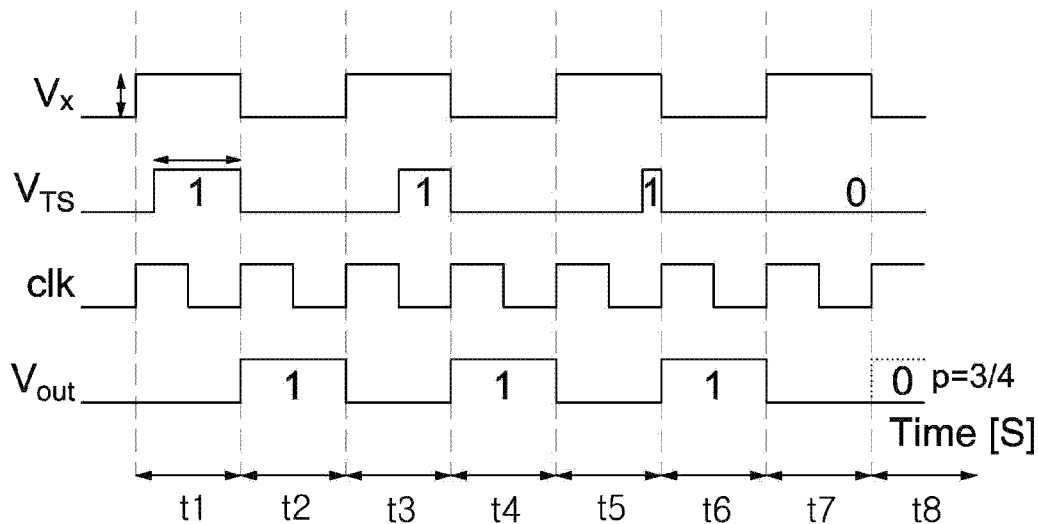
FIGS. 13A and 13B show timing diagrams for describing a probability signal converting operation according to an amplitude of an input voltage in the analog-stochastic converter shown in FIG. 12.
Figure 13B:
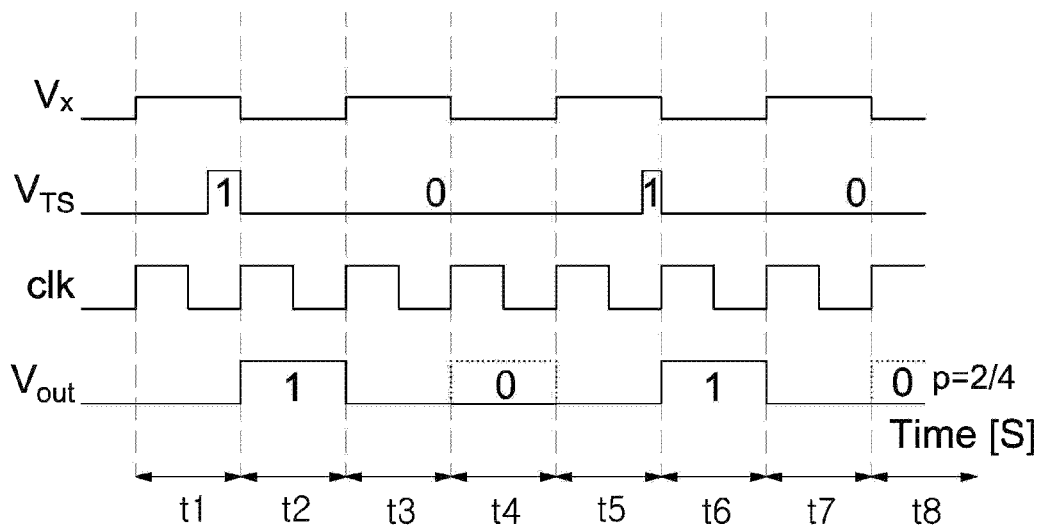

FIGS. 13A and 13B show timing diagrams for describing a probability signal converting operation according to an amplitude of an input voltage in the ASC shown in FIG. 12.

That is, the timing diagrams shown in FIGS. 13A and 13B illustrate a change in probability signal according to a change in amplitude of a pulse signal $V_x$ applied to the threshold switching element 100.

First, referring to FIG. 13A, when the pulse signal V, is applied to the threshold switching element 100, the threshold switching element 100 outputs a signal $V_{TS}$ according to the pulse signal $V_x$. In addition, the D flip-flop 210 detects the output signal $V_{TS}$ and outputs a probability signal according to the signal $V_{TS}$. That is, when the threshold switching element 100 is turned on within a pulse width of the pulse signal $V_x$ and the signal $V_{TS}$ has a value of 1, the D flip-flop 210 detects a value of 1 of the signal $V_{TS}$ in a rising edge section of a clock signal CLK and outputs an output signal $V_{out}$ having a value of 1. On the other hand, when the threshold switching element is not turned on within the pulse width of the pulse signal $V_x$ and the signal $V_{TS}$ has a value of 0, since the D flip-flop 210 does not detect a value of 1 of the signal $V_{TS}$ in the rising edge section, the D flip-flop 210 outputs the output signal $V_{out}$ as a value of 0.

As an example, as shown in FIG. 13A, the signal $V_{TS}$ has a value of 1 in sections t1, t3, and t5 in which the threshold switching element 100 is turned on within the pulse width of the pulse signal $V_x$, and the signal $V_{TS}$ is output as a value of 0 in a section t7 in which the threshold switching element 100 is not turned on.

The D flip-flop 210 receives the signal $V_{TS}$ output from the threshold switching element 100 and the clock signal CLK and determines an output signal according to the signal $V_{TS}$ and the clock signal CLK. For example, the output signal $V_{out}$ has a value of 1 in sections t2, t4, and t6 in which a value of 1 is detected in a rising edge section of the clock signal CLK, and the output signal $V_{out}$ has a value of 0 in a section t8 in which a value of 1 is not detected in the rising edge section of the clock signal CLK. Accordingly, a probability signal converted in FIG. 13A may have a probability of P=3/4.

Subsequently, referring to FIG. 13B, an amplitude of a pulse signal $V_x$ applied to the threshold switching element 100 in FIG. 13B is less than the amplitude of the pulse signal $V_x$ applied in FIG. 13A.

That is, a signal $V_{TS}$ turned on within the pulse width of the pulse signal $V_x$ may be decreased due to a decreased amplitude.

As an example, the signal $V_{TS}$ has a value of 1 in sections t1 and t5 in which the threshold switching element 100 is turned on within the pulse width of the pulse signal $V_x$, and the signal $V_{TS}$ has a value of 0 in sections t3 and t7 in which the threshold switching element 100 is not turned on. That is, an output signal $V_{out}$ has a value of 1 in sections t2 and t6 in which a value of 1 is detected in a rising edge section of a clock signal CLK, and the output signal $V_{out}$ has a value of 0 in a section t8 in which a value of 1 is not detected in the rising edge section of the clock signal CLK. Accordingly, a probability signal converted in FIG. 13B by the output signal $V_{out}$ of the D flip-flop 210 may have a probability of P=2/4.

That is, as shown in FIGS. 13A and 13B, it can be confirmed that, when the amplitude of the pulse signal $V_x$ input to the threshold switching element 100 is increased, a probability value of an output probability signal is increased. This may be described as an example in which a turn-on probability is increased as an amplitude of a pulse shown in FIG. 9 is increased.

Figure 14A:
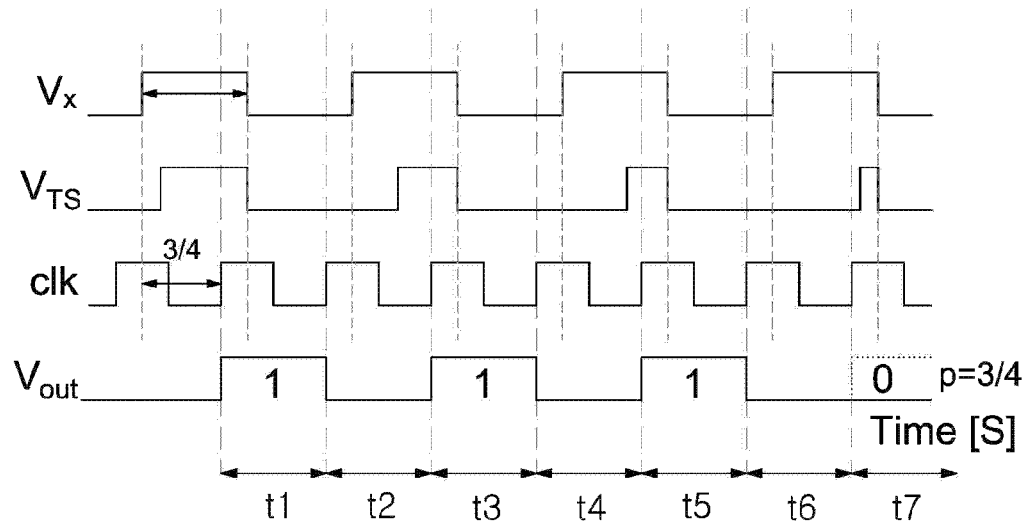
FIGS. 14A and 14B show timing diagrams for describing a probability signal converting operation according to a change in an applied clock signal in the analog-stochastic converter shown in FIG. 12.
Figure 14B:
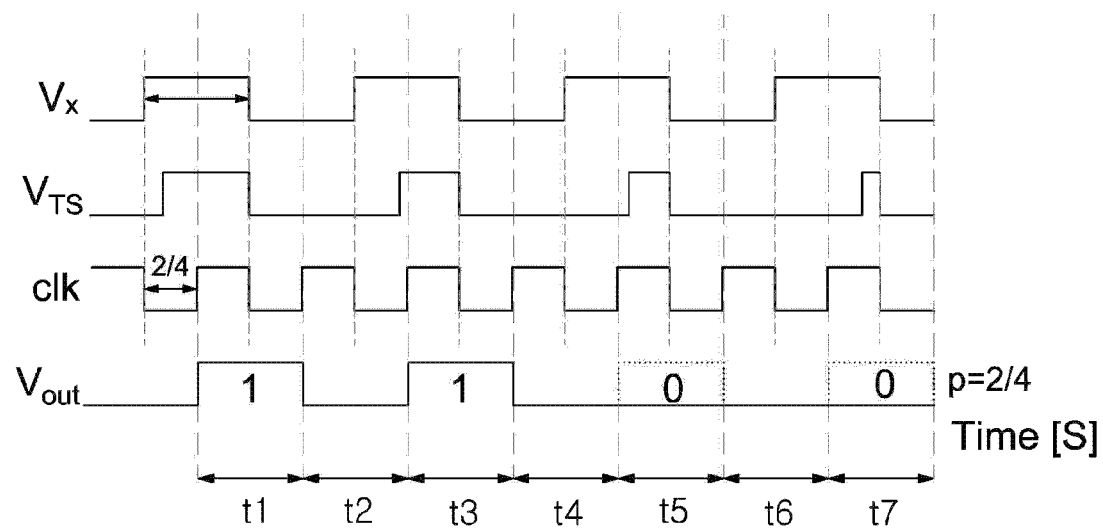

FIGS. 14A and 14B show timing diagrams for describing a probability signal converting operation according to a change in an applied clock signal CLK in the ASC shown in FIG. 12.

First, referring to FIG. 14A, the threshold switching element 100 outputs a signal VTS according to a pulse signal $V_x$. In this case, a timing at which the clock signal CLK is applied to the D flip-flop 210 may be adjusted to adjust a detection time for the D flip-flop 210 to detect a turn-on signal of the threshold switching element 100.

As an example, in FIG. 14A, a pulse of the clock signal CLK input to the D flip-flop 210 may be input 3/4 wavelength later than the input pulse signal V. This causes an output signal $V_{out}$ to have a value of 1 in sections t1, t3, and t5 in which a value of 1 is detected at a rising edge of the clock signal CLK and causes the output signal $V_{out}$ to have a value of 0 in a section t7 in which a value of 1 is not detected at the rising edge of the clock signal CLK. Accordingly, a probability signal converted in FIG. 14A by the output signal $V_{out}$ of the D flip-flop 210 may have a probability of P=3/4.

Subsequently, referring to FIG. 14B, a pulse of the clock signal CLK may be input 2/4 wavelength later than an input pulse signal $V_x$. That is, in the clock signal CLK applied in FIG. 14B, a pulse width of the delayed clock signal CLK may be less than that of the clock signal CLK applied in FIG. 14A.

This causes an output signal $V_{out}$ to have a value of 1 in sections t1 and t3 in which a value of 1 is detected at a rising edge of the clock signal CLK and causes the output signal $V_{out}$ to have a value of 0 in sections t5 and t7 in which a value of 1 is not detected at the rising edge of the clock signal CLK. Accordingly, a probability signal converted in FIG. 14B by the output signal $V_{out}$ of the D flip-flop 210 may have a probability of P=2/4.

That is, as shown in FIGS. 14A and 14B, it can be confirmed that, when the pulse width of the delayed clock signal CLK is increased compared to the input pulse signal $V_x$, a probability value of an output probability signal is increased. This may be described as an example in which a turn-on probability is increased as a pulse width shown in FIG. 10 is increased.

Figure 15:
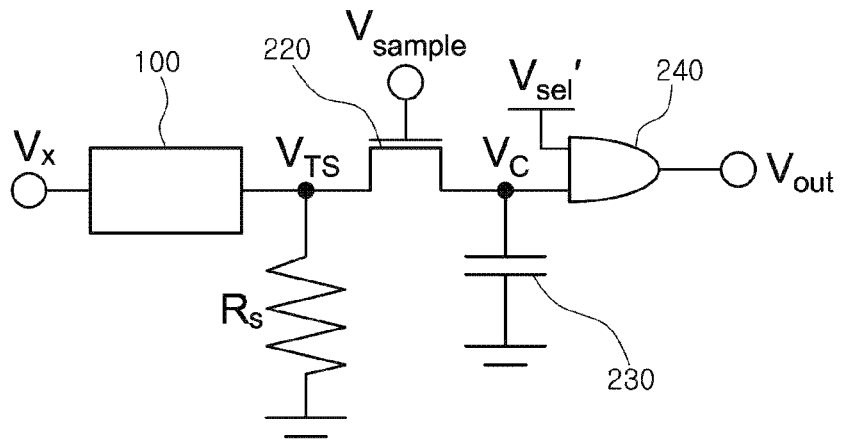
FIG. 15 is a diagram illustrating an analog-stochastic converter according to a second example embodiment of the present invention.

FIG. 15 is a diagram illustrating an ASC according to a second example embodiment of the present invention.

Referring to FIG. 15, the ASC according to the second example embodiment of the present invention may include a threshold switching element 100, a resistor $R_s$, a transistor 220, a capacitor 230, and an AND gate 240.

The threshold switching element 100 and the resistor $R_s$ have the same configurations as those of the ASC shown in FIG. 11, and a probability conversion circuit 200 may include the transistor 220, the capacitor 230, and the AND gate 240.

That is, a pulse signal $V_x$ corresponding to an analog signal is input to the threshold switching element 100, and an output signal $V_{TS}$ output from the threshold switching element 100 is stored in the capacitor 230 by a sample signal $V_{sample}$ applied to a gate of the transistor 220. A storage signal $V_c$ stored in the capacitor 230 and a select signal $V_{sel}$ are input to the AND gate 240, and a probability signal is output using the storage signal $V_c$ and the select signal $V_{sel}$.

Figure 16:
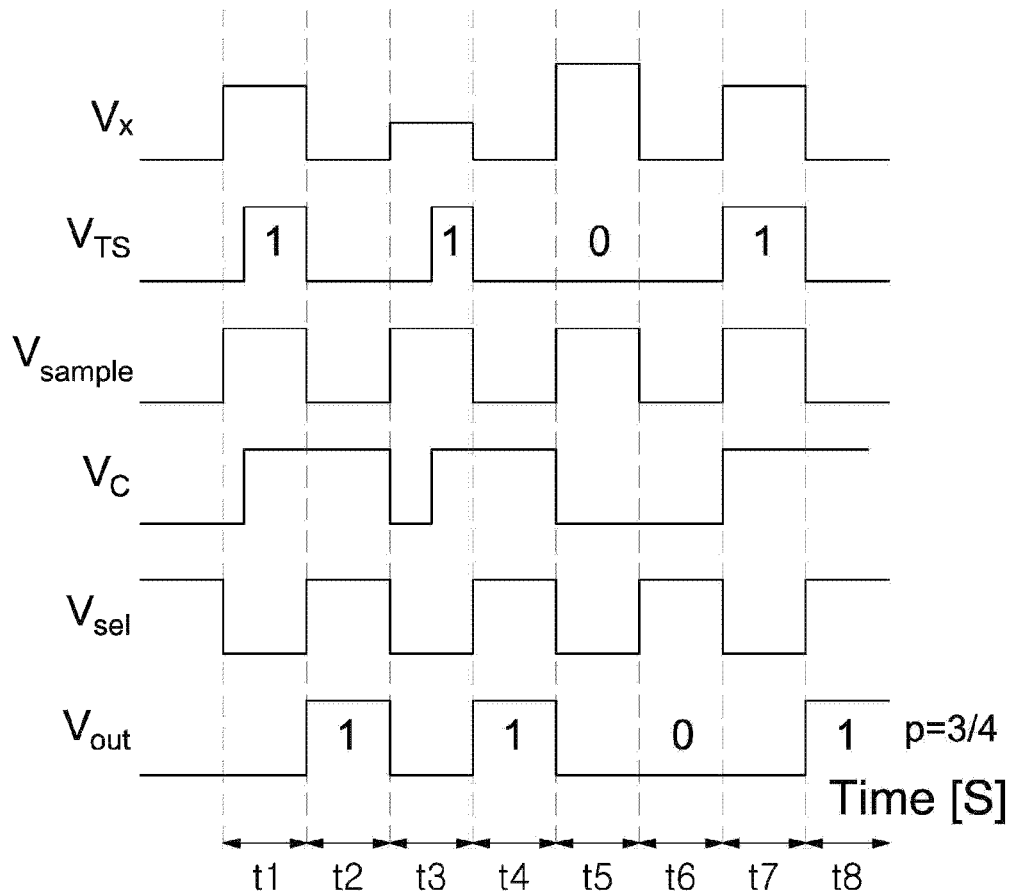
FIG. 16 is a timing diagram for describing a probability signal converting operation according to an amplitude of an input voltage in the analog-stochastic converter shown in FIG. 15.

FIG. 16 is a timing diagram for describing a probability signal converting operation according to an amplitude of an input voltage in the ASC shown in FIG. 15.

Referring to FIG. 16, when a pulse signal $V_x$ having various amplitudes is applied to the threshold switching element 100, the threshold switching element 100 outputs a signal $V_{TS}$ according to the pulse signal $V_x$. In this case, the transistor 220 receives the signal $V_{TS}$, a sample signal $V_{sample}$ is applied to the gate of the transistor 220, and the output signal $V_{TS}$ is stored in the capacitor 230 during a time in which the transistor 220 is turned on. A storage signal $V_c$ is input to the AND gate 240 together with a select signal $V_{sel}$, and the AND gate 240 determines an output probability signal using e input storage signal $V_c$ and the input select signal $V_{sel}$. When the threshold switching element 100 is turned on and the storage signal $V_c$ stored in the capacitor 230 has a value of 1, an output signal $V_{out}$ has a value of 1 due to the select signal $V_{sel}$. In addition, when the storage signal $V_c$ stored in the capacitor 230 has a value of 0, the output signal $V_{out}$ has a value of 0 due to the select signal $V_{sel}$.

As an example, as shown in FIG. 16, when the signal $V_{TS}$ has a value of 1 in sections t1, t3, and t7 according to the input pulse signal $V_x$, the signal $V_{TS}$ is stored in the capacitor 230 by the sample signal $V_{sample}$ applied to the gate of the transistor 220. The signal $V_c$ stored in the capacitor 230 is input to the AND gate 240, and the output signal $V_{out}$ has a value of 1 in sections t2, t4, and t8 by the select signal $V_{sel}$ input to the AND gate 240. In addition, the output signal $V_{out}$ has a value of 0 in a section t6 in which the stored signal $V_c$ is not detected while the select signal $V_{sel}$ is applied. Accordingly, a probability signal converted in FIG. 16 may have a probability of P=3/4.

Figure 17:
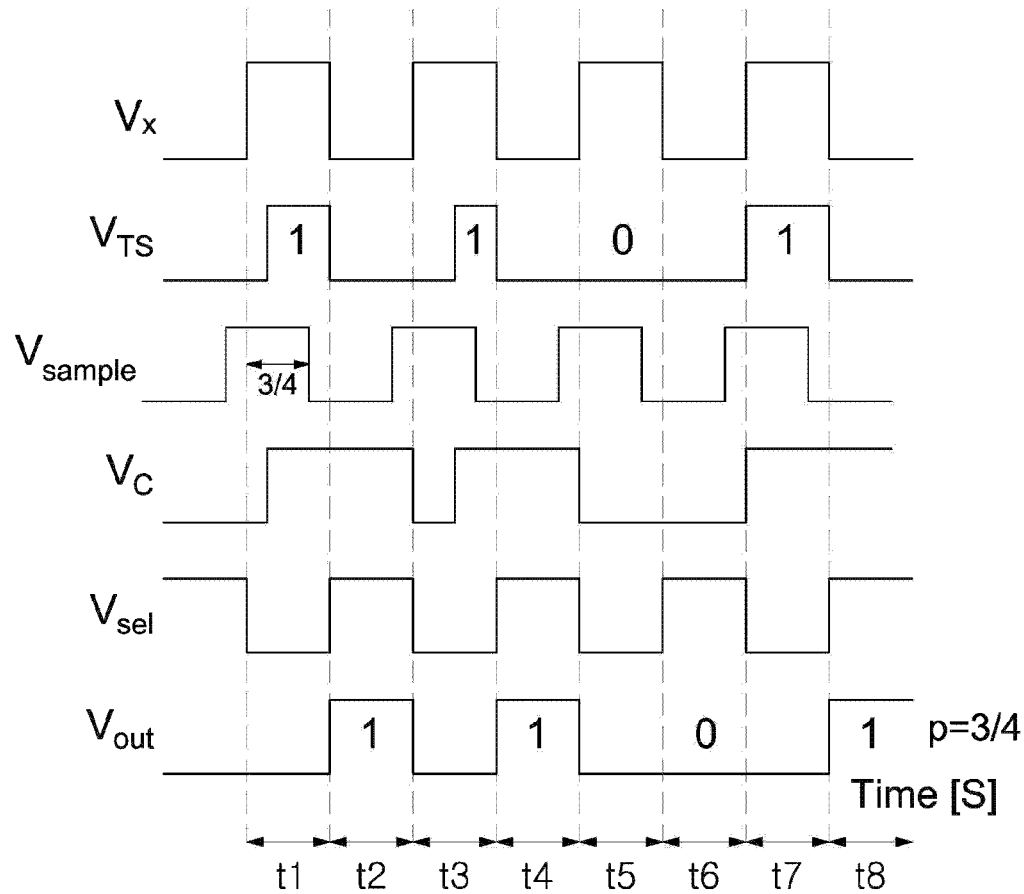
FIG. 17 is a timing diagram for describing a probability signal converting operation according to a change in sample signal in the analog-stochastic converter shown in FIG. 15.

FIG. 17 is a timing diagram for describing a probability signal converting operation according to a change in sample signal in the ASC shown in FIG. 15.

Referring to FIG. 17, the threshold switching element 100 outputs a signal $V_{TS}$ according to a pulse signal $V_x$. In this case, a timing at which a sample signal $V_{sample}$ is applied may be adjusted to adjust a detection time for detecting the turning on of the threshold switching element 100.

As an example, as shown in FIG. 17, at a time at which a rising pulse of the sample signal $V_{sample}$ overlaps the pulse signal $V_x$, when the sample signal $V_{sample}$ is applied so as to overlap the pulse signal $V_x$ by 3/4 of the rising pulse, an output signal $V_{out}$ has a value of 1 in sections t2, t4, and t8 and has a value of 0 in a section t6. Accordingly, a probability signal converted in FIG. 17 may have a probability of P=3/4.

Figure 18:
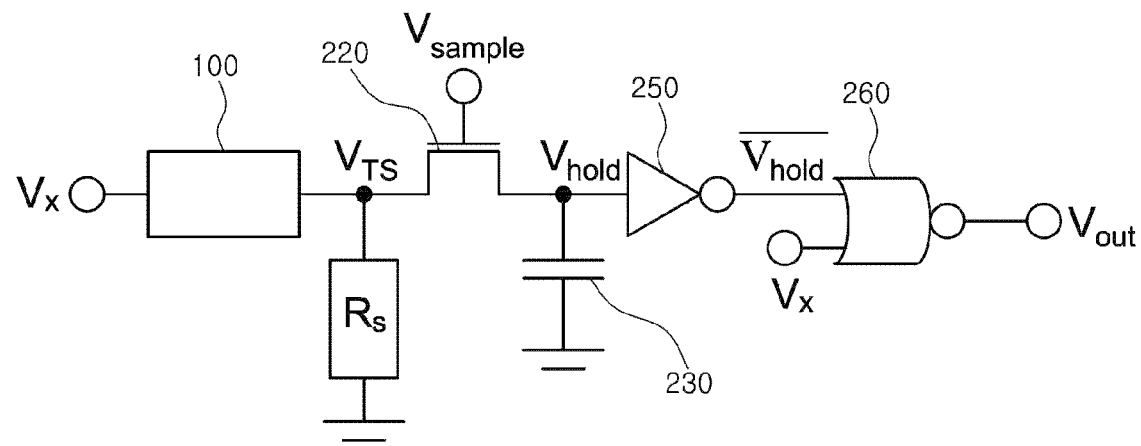
FIG. 18 is a diagram illustrating an analog-stochastic converter according to a third example embodiment of the present invention.

FIG. 18 is a diagram illustrating an ASC according to a third example embodiment of the present invention.

Referring to FIG. 18, the ASC according to the third example embodiment of the present invention may include a threshold switching element 100, a resistor $R_s$, a transistor 220, a capacitor 230, a NOT gate 250, and a NOR gate 260.

The threshold switching element 100, the resistor $R_s$, the transistor 220, and the capacitor 230 may have the same configurations as those of the second example embodiment shown in FIG. 15. However, the NOT gate 250 and the NOR gate 260 may be included instead of the AND gate 240 of the second example embodiment. This is to perform an operation using only a pulse signal $V_x$ input without the separate select signal $V_{sel}$ applied to the AND gate 240 of the second example embodiment.

That is, the input pulse signal $V_x$ is input to the threshold switching element 100, and an output signal $V_{TS}$ output from the threshold switching element 100 is stored in the capacitor 230 by a sample signal $V_{sample}$ applied to a gate of the transistor 220. A storage signal $V_{hold}$ stored in the capacitor 230 is applied to the NOT gate 250, and an output signal $V_{hold}'$ output from the NOT gate 250 and the pulse signal $V_x$ are applied to the NOR gate 260. The NOR gate 260 determines a probability signal using the input output signal $V_{hold}'$ and the input pulse signal $V_x$. As an example, an output signal Vout is output only when the pulse signal $V_x$ has a value of 0 and the output signal $V_{hold}'$ has a value of 0.

In this case, the pulse signal $V_x$ is divided into a detection section Detect and a program section PGM. As an example, a section in which the pulse signal $V_x$ has a value of 1 is a section in which the output signal $V_{TS}$ is detected, and a section in which the pulse signal $V_x$ has a value of 0 is a section in which an operation of firing a detection result to a synaptic element is performed.

Figure 19:
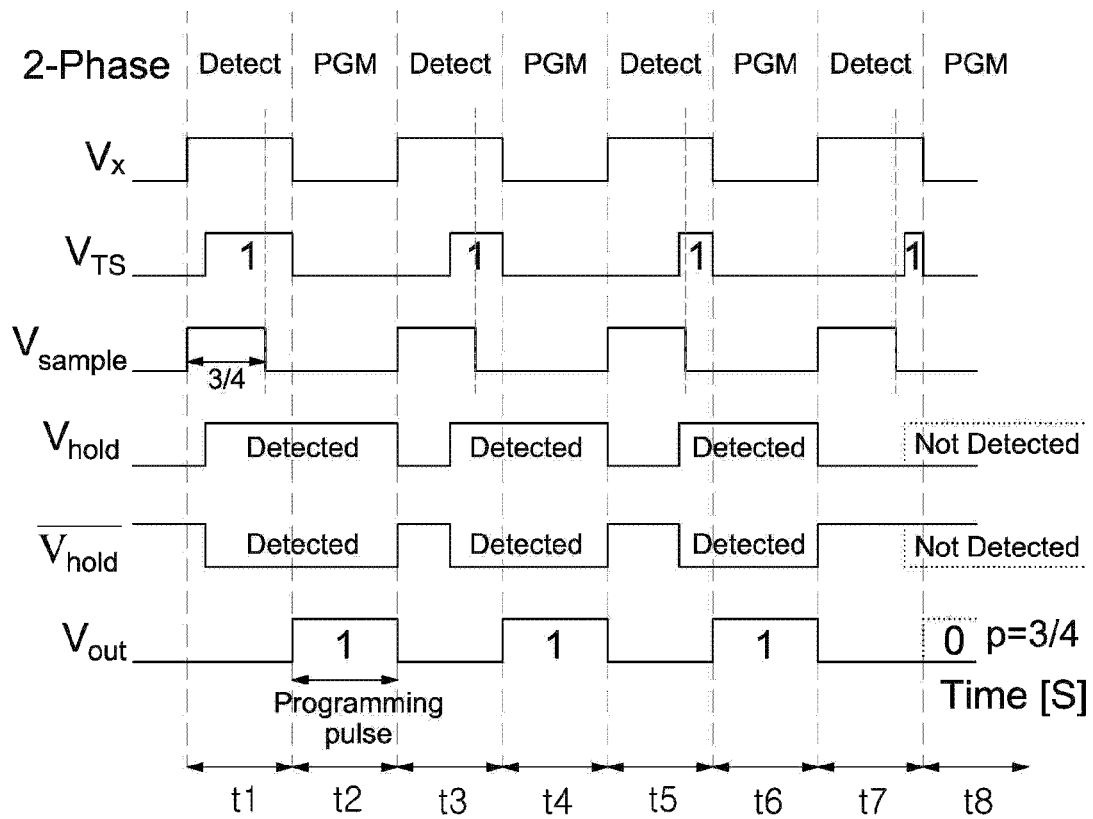
FIG. 19 is a timing diagram for describing an operation of the analog-stochastic converter shown in FIG. 18.

FIG. 19 is a timing diagram for describing an operation of the ASC shown in FIG. 18.

Referring to FIG. 19, when a signal $V_{TS}$ has a value of 1 in sections t1, t3, t5, and t7 according to an input pulse signal $V_x$, the signal $V_{TS}$ is stored in the capacitor 230 by a sample signal $V_{sample}$ applied to the gate of the transistor 220. In this case, the sample signal $V_{sample}$ may be applied to have a pulse width that is 3/4 of a pulse width of the pulse signal $V_x$. A storage signal $V_{hold}$ stored in the capacitor 230 is input to the NOT gate 250 according to the sample signal $V_{sample}$, and an output signal $V_{hold}'$ output by being inverted by the NOT gate 250 is applied to the NOR gate 260 together with the pulse signal $V_x$. Due to the output signal $V_{hold}'$ and the pulse signal $V_x$ which are applied to the NOR gate 260, an output signal Vout has a value of 1 in sections t2, t4, and t6 and has a value of 0 in a section t8. Accordingly, a probability signal converted in FIG. 19 may have a probability of P=3/4.

As described above, an ASC is implemented using a threshold switching element 100 and a simple logic circuit, thereby reducing a size of the ASC and enabling a low power operation thereof. In addition, in order to update a weight, instead of an analog signal, a probability signal is applied using the above-described ASC, thereby updating a weight in a fully-parallel manner in a synaptic element array having an intersection structure. Accordingly, it is possible to shorten a time for weight update.

Technical effects of the present invention are not limited to those referred to above and other technical effects which are not referred to herein will be understood by those of ordinary skill in the art.

Meanwhile, the example embodiments of the present invention shown in the present specification and drawings are for enhancing understanding and are not intended to limit the scope of the present invention. It is clear to a person with ordinary knowledge in the art to which the present invention belongs that other modified example embodiments based on the technical concepts of the present invention are possible besides the disclosed example embodiments.

[Descriptions of Reference Numerals]

| | |
|---|---|
| 100: threshold switching element | 200: probability conversion circuit |
| 210: D flip-flop | 220: transistor |
| 230: capacitor | 240: AND gate |
| 250: NOT gate | 260: NOR gate |

What is claimed is:

1. An analog-stochastic converter, comprising:
a threshold switching element configured to receive a pulse signal corresponding to an analog signal and be turned on according to the input -pulse signal to output a turn-on signal; and
a probability conversion circuit configured to detect the turn-on signal output from the threshold switching element and convert the analog signal into a probability signal using the detected turn-on signal,
wherein the probability conversion circuit includes:
a transistor which is configured to receive the turn-on signal and in which a sample signal is to be applied to a gate thereof;
a capacitor connected to the transistor and configured to store the turn-on signal; and
an AND gate configured to receive a storage signal stored in the capacitor and a select signal and output the probability signal.

2. The analog-stochastic converter of claim 1, wherein the probability signal is to be determined according to an amplitude of the pulse signal.

3. The analog-stochastic converter of claim 2, wherein, as the amplitude of the pulse signal is increased, a probability of the probability signal is to be increased, and as the amplitude of the pulse signal is decreased, the probability of the probability signal is to be decreased.

4. The analog-stochastic converter of claim 1, further comprising a resistor connected to an output terminal of the threshold switching element.

5. The analog-stochastic converter of claim 1, wherein, while the transistor is turned on by the sample signal, the turn-on signal is stored in the capacitor.

6. The analog-stochastic converter of claim 1, wherein the probability signal is to be determined by the storage signal and the select signal.

7. The analog-stochastic converter of claim 1, wherein the probability signal is to be determined according to a timing at which the sample signal is input with respect to the pulse signal.

8. An analog-stochastic converter, comprising:
a threshold switching element configured to receive a pulse signal corresponding to an analog signal and be turned on according to the pulse signal to output a turn-on signal; and
a probability conversion circuit configured to detect the turn-on signal output from the threshold switching element and convert the analog signal into a probability signal using the detected turn-on signal,
wherein the probability conversion circuit includes:
a transistor which is configured to receive the turn-on signal and in which a sample signal is to be applied to a gate thereof;
a capacitor connected to the transistor and configured to store the turn-on signal;
a NOT gate configured to receive a storage signal stored in the capacitor and invert the storage signal to output an inverted signal; and
a NOR gate configured to receive the inverted signal and the pulse signal and output the probability signal.

9. The analog-stochastic converter of claim 8, wherein the probability signal is to be determined by the inverted signal and the pulse signal.

10. The analog-stochastic converter of claim 8, wherein the probability signal is to be determined according to a timing at which the sample signal is input with respect to the pulse signal.

11. The analog-stochastic converter of claim 8, wherein the pulse signal includes:
a detection section in which the turn-on signal is to be detected; and
a program section (PGM) in which an operation of firing a detection result detected in the detection section to a synaptic element is to be performed.

12. The analog-stochastic converter of claim 8, wherein the probability signal is to be determined according to an amplitude of the pulse signal.

13. The analog-stochastic converter of claim 8, further comprising a resistor connected to an output terminal of the threshold switching element.

14. The analog-stochastic converter of claim 12, wherein, as the amplitude of the pulse signal is increased, a probability of the probability signal is to be increased, and as the amplitude of the pulse signal is decreased, the probability of the probability signal is to be decreased.

* * * * *